United States Patent
Hoegberg et al.

(10) Patent No.: US 11,637,392 B2
(45) Date of Patent: Apr. 25, 2023

(54) ELECTRICAL MATING SYSTEMS

(71) Applicant: Hamilton Sundstrand Corporation, Charlotte, NC (US)

(72) Inventors: Lon R. Hoegberg, Belvidere, IL (US); Brennan Fox, Geneseo, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 98 days.

(21) Appl. No.: 16/736,287

(22) Filed: Jan. 7, 2020

(65) Prior Publication Data

US 2021/0210884 A1 Jul. 8, 2021

(51) Int. Cl.
| | | |
|---|---|---|
| *H01R 13/04* | (2006.01) | |
| *H01R 43/20* | (2006.01) | |
| *H01R 13/42* | (2006.01) | |
| *H01R 13/717* | (2006.01) | |
| *H01R 24/28* | (2011.01) | |
| *H05K 7/02* | (2006.01) | |

(52) U.S. Cl.
CPC ............ *H01R 13/04* (2013.01); *H01R 13/42* (2013.01); *H01R 13/717* (2013.01); *H01R 24/28* (2013.01); *H05K 7/02* (2013.01); *H01R 43/20* (2013.01)

(58) Field of Classification Search
CPC ...... H01R 13/641; H01R 13/64; H01R 13/04; H01R 13/42; H01R 13/717; H01R 24/28; H01R 13/08; H05K 7/02
See application file for complete search history.

(56) References Cited

U.S. PATENT DOCUMENTS

| | | | |
|---|---|---|---|
| 4,915,648 A | 4/1990 | Takase et al. | |
| 5,235,740 A | 8/1993 | Kroeker et al. | |
| 6,919,813 B2 | 7/2005 | Barr et al. | |
| 6,933,853 B2 | 8/2005 | Barr et al. | |
| 7,278,791 B2 | 10/2007 | Demaret et al. | |
| 8,226,443 B2 * | 7/2012 | Pipho ..................... | H05K 3/366 |
| | | | 439/630 |
| 9,105,993 B2 * | 8/2015 | Schratz ................. | H01R 13/08 |
| 2005/0000242 A1 | 2/2005 | Shidla et al. | |
| 2005/0024220 A1 | 2/2005 | Shidla et al. | |
| 2013/0000177 A1 | 1/2013 | Parke | |

(Continued)

FOREIGN PATENT DOCUMENTS

| | | | |
|---|---|---|---|
| DE | 102011050638 A1 | 3/2012 | |
| GB | 2258770 A * | 2/1993 | ........... H01R 13/703 |

OTHER PUBLICATIONS

Extended European search report issued in corresponding EP application No. 21150492.3, dated May 7, 2021.

*Primary Examiner* — Briggitte R. Hammond
(74) *Attorney, Agent, or Firm* — Locke Lord LLP; Daniel J. Fiorello; Gabrielle L. Gelozin

(57) ABSTRACT

An electrical mating system can include a first connector having a plurality of first contacts, and a second connector having a plurality of second contacts. Each one of the first contacts can pair with one of the second contacts so that they provide electrical conduction between pairs of contacts when the first connector is properly mated to the second connector. At least one of the first contacts or first connector and/or one of the second contacts and the second connector can be sized and configured such that an open circuit occurs across a specific one of the pairs of contacts when the first connector is improperly mated to the second connector.

3 Claims, 2 Drawing Sheets

(56) References Cited

U.S. PATENT DOCUMENTS

2013/0017732 A1 1/2013 Parke
2013/0330940 A1* 12/2013 Hasse ................ H01R 13/6586
439/676

* cited by examiner

ELECTRICAL MATING SYSTEMS

FIELD

This disclosure relates to electrical mating systems for circuit components, e.g., for line replaceable units (LRUs).

BACKGROUND

Circuit boards are often not fully seated during assembly resulting in possible disengagement of the connector as the unit is effected by vibration and temperature cycles. Line replaceable unit (LRU) connector can suffer from the same issue.

Such conventional methods and systems have generally been considered satisfactory for their intended purpose. However, there is still a need in the art for improved electrical mating systems. The present disclosure provides a solution for this need.

SUMMARY

In accordance with at least one aspect of this disclosure, an electrical mating system can include a first connector having a plurality of first contacts, and a second connector having a plurality of second contacts. Each one of the first contacts can pair with one of the second contacts so that they provide electrical conduction between pairs of contacts when the first connector is properly mated to the second connector. At least one of the first contacts or first connector and/or one of the second contacts and the second connector can be sized and configured such that an open circuit occurs across a specific one of the pairs of contacts when the first connector is improperly mated to the second connector.

A length of overlapping engagement between the first contacts and second contacts can be less than a length of overlapping engagement of a plurality of the remaining contacts such that the first contacts and second contacts will not engage when the first connector to a second connector are improperly mated.

The specific one of the pairs can be located at matching ends of the first and second connectors. The specific one of the pairs can be a spare pair or not needed for the function of a circuit. The system can include a module configured to monitor the one of the specific pair for engagement to determine if the first and second connector are improperly or properly mated.

In accordance with at least one aspect of this disclosure, an electrical mating system can include an electrical mating surface having a plurality of contactors, each contactor at least as long as a first length, the plurality of contactors configured to mate with a plurality of opposing contactors of an opposing mating surface. The electrical mating surface can include at least one seating contactor having a second length shorter than the first length. The system can include a contact module configured to determine if the at least one seating contactor is contacting an opposing seating contactor of an opposing mating surface. The contact module can be configured to activate an indicator to indicate whether the electrical mating surface and the opposing mating surface are properly seated together.

In certain embodiments, the second length can be less than half of the first length. Any other suitable length less than the first length is contemplated herein.

In certain embodiments, the plurality of contactors can be pins, the opposing contactors can be sockets, the opposing seating contactor can be an opposing seating socket, and the at least one seating contactor can be a seating contactor pin configured to insert into the seating opposing socket. In certain embodiments, the plurality of contactors can be sockets, the opposing contactors can be pins, the opposing seating contactor can be an opposing seating pin, and the at least one seating contactor can be a seating contactor socket configured to receive the seating opposing pin.

In certain embodiments, the contact module can be mounted to electrical mating surface and electrically connected to at least the seating contactor pin. Any other suitable location and configuration for the contact module is contemplated herein.

The contact module can include an LED, for example. The contact module can be configured to illuminate the LED for at least a period of time when the seating contactor is in contact with the opposing seating contactor. In certain embodiments, the contact module can be configured to illuminate the LED until the seating contactor is in contact with the opposing seating contactor.

In certain embodiments, the system can include the opposing mating surface (e.g., a female connector if the electrical mating surface is male, and vice versa).

In accordance with at least one aspect of this disclosure, a line replaceable unit (LRU) can include an electrical mating surface as disclosed herein, e.g., as described above. The LRU can include any other suitable components, for example.

A method can include inserting a plurality of pins of an LRU into a plurality of sockets of a receiving board and detecting if a seating pin of an LRU is fully seated in a seating socket of the receiving board. In certain embodiments, the seating pin can be shorter than the plurality of pins. In certain embodiments, the seating socket can be shorter than the plurality of sockets.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
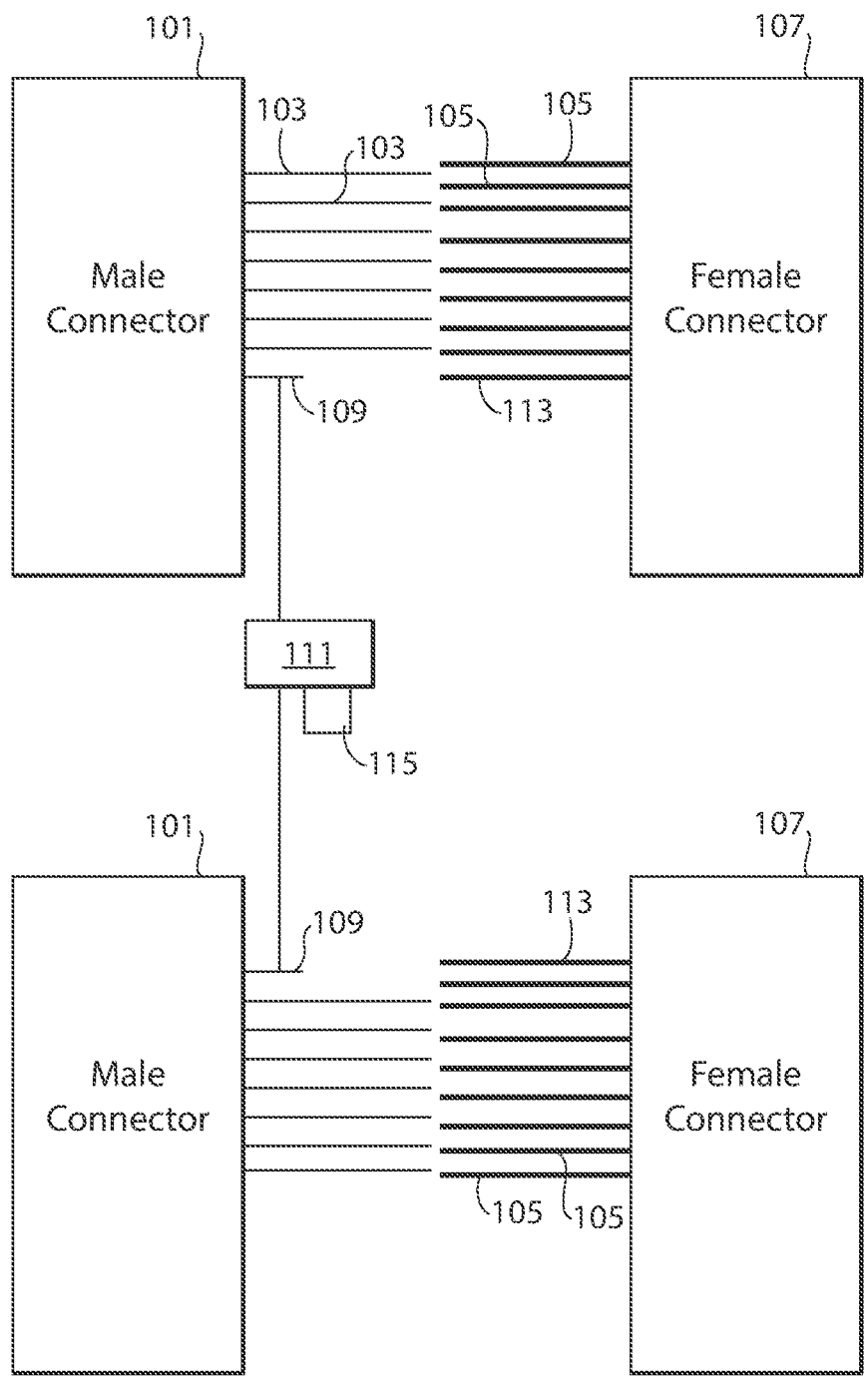
FIG. 1 is a schematic diagram of an embodiment of a system in accordance with this disclosure, showing a shorter seating contactor pin.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100.

Figure 2:
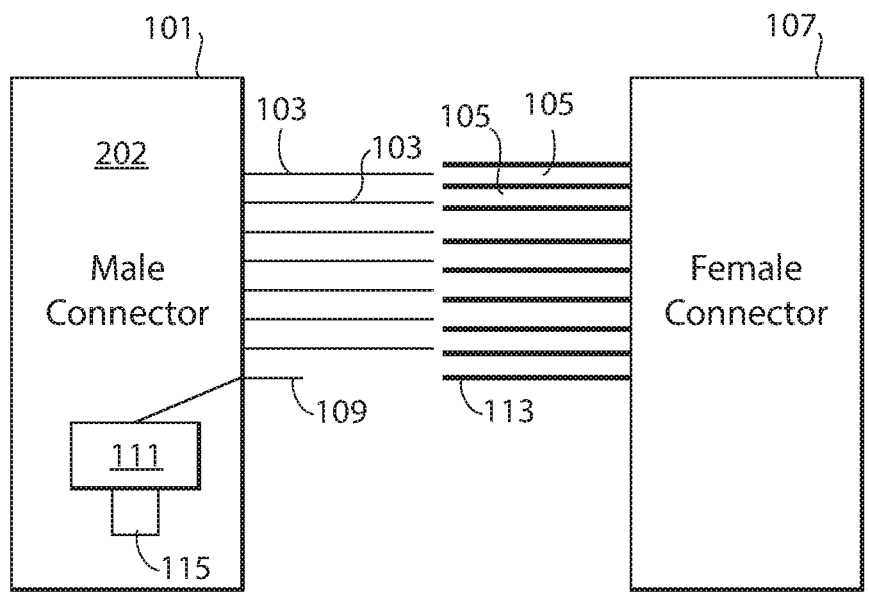
FIG. 2 is a schematic diagram of an embodiment of a system in accordance with this disclosure, shown having a contact module integrated with an electrical mating surface.
Figure 3:
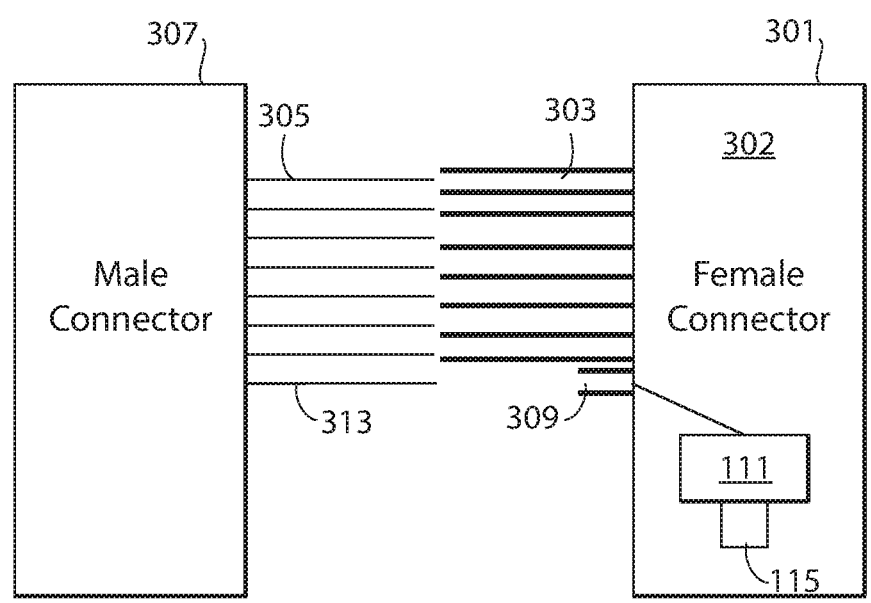
FIG. 3 is a schematic diagram of an embodiment of a system in accordance with this disclosure, showing a shorter seating contactor socket.

Other embodiments and/or aspects of this disclosure are shown in FIGS. 2 and 3. Certain embodiments described herein can be used to ensure that a circuit module (e.g., an LRU) is properly mated to another circuit (e.g., a motherboard), or for any other suitable use.

Referring to FIG. 1, an electrical mating system 100 can include an electrical mating surface 101 having a plurality of contactors 103, each contactor 103 at least as long as a first length. The plurality of contactors 103 can be configured to mate with a plurality of opposing contactors 105 of an opposing mating surface 107. The electrical mating surface 101 can include at least one seating contactor 109 having a second length shorter than the first length.

In certain embodiments, the second length can be less than half of the first length (e.g., as shown). Any other suitable length less than the first length is contemplated herein. In certain embodiments, the same or similar pin lengths can be used. For example, the inclusion of a mating pin in general can be used to ensure that the connector is engaged correctly. In some cases, connectors have been seated with pins not engaged at all. The use of a full length male and female pin could provide a simple basic seating check for the connector. Any other suitable lengths are contemplated herein.

The system 100 can include a contact module 111 configured to determine if the at least one seating contactor 109 is contacting an opposing seating contactor 113 of an opposing mating surface 107. The contact module 111 can be configured to activate an indicator (e.g., send an indicator signal to a display) to indicate whether the electrical mating surface 101 and the opposing mating surface 107 are properly seated together (e.g., such that the contactors 103 are fully seated in the opposing contactors 105). The contact module 111 can be or include any suitable hardware module and/or software module configured to perform any suitable function disclosed herein. The control module 111 can be configured to communicate wirelessly or wired with a display system (e.g., including at least one LED) or any other suitable indicator system (e.g., visual, audible, tactile, data signals, etc).

Certain embodiments of an indicator system can include providing the status to an onboard circuit to utilize, such as a processor and/or logic device. In certain embodiments, such a device can disable operation if all boards are not sensed as seated, or could provide indication, e.g., visual, audible, tactile, and/or signals (analog and/or digital) via a communications interface (e.g., Ethernet).

Certain embodiment can also entirely use external test equipment to check the seating. For example, an external LRU connector can be used that has, e.g., two pins that, when all boards are seated correctly, will be connected. Such test equipment can confirm this connection, for example. If any board (e.g., one or more boards of a system having one or a plurality of boards total) is not fully seated, the two pins would not be connected in such an embodiment. Any other suitable logic for detecting seating is contemplated herein.

In certain embodiments, as shown in FIG. 1, the plurality of contactors 103 can be pins, the opposing contactors 105 can be sockets, the opposing seating contactor 113 can be an opposing seating socket, and the at least one seating contactor 109 can be a seating contactor pin configured to insert into the seating opposing socket. In certain embodiments, e.g., as shown in FIG. 3, the plurality of contactors 303 can be sockets, the opposing contactors 305 can be pins, the opposing seating contactor 313 can be an opposing seating pin, and the at least one seating contactor 309 can be a seating contactor socket configured to receive the seating opposing pin.

In certain embodiments, as shown in FIGS. 2 and 3, in systems 200, 300, for example, the contact module 111 can be mounted to electrical mating surface 101 and electrically connected to at least the seating contactor pin. Any other suitable location and configuration for the contact module 111 is contemplated herein.

The contact module 111 can include an LED 115, for example. The contact module 111 can be configured to illuminate the LED 115 for at least a period of time when the seating contactor 109, 309 is in contact with the opposing seating contactor 113, 313. In certain embodiments, the contact module 111 can be configured to illuminate the LED 115 until the seating contactor 109, 309 is in contact with the opposing seating contactor 113, 313.

In certain embodiments, the system 100 can include the opposing mating surface 107, 307 (e.g., a female connector if the electrical mating surface 101, 301 is male, and vice versa). In certain embodiments, a complete circuit can be made (e.g., through another contactor pair) once the seating contactor and the opposing seating contactor mate and close the circuit. It is contemplated that a plurality of mating surfaces can be utilized to create a daisy chain circuit to determine if the plurality of mating surfaces are properly seated such that the contact module 111 is configured to determine if all mating surfaces are properly seated. In certain embodiments, it is contemplated that the opposing mating surface 107, 307 can be operatively connected to the contact module 111 instead of and/or in addition to the mating surfaces 101, 301.

In accordance with at least one aspect of this disclosure, an electrical mating system, e.g., 100, 200, 300 can include a first connector (e.g., 101) having a plurality of first contacts (e.g., 103), and a second connector (e.g., 107) having a plurality of second contacts (e.g., 105). Each one of the first contacts can pair with one of the second contacts so that they provide electrical conduction between pairs of contacts when the first connector is properly mated to the second connector. At least one of the first contacts or first connector and/or one of the second contacts and the second connector can be sized and configured such that an open circuit occurs across a specific one of the pairs (e.g., the pair of 109 and 113) of contacts when the first connector is improperly mated to the second connector. The connector can locate one of the same dimensioned contacts so that it open circuits before the others when not fully engaged, in certain embodiments.

A length of overlapping engagement between the first contacts and second contacts can be less than a length of overlapping engagement of a plurality of the remaining contacts such that the first contacts and second contacts will not engage when the first connector to a second connector are improperly mated, e.g., as shown in FIGS. 1-3. The specific one of the pairs (e.g., 109 and 113) can be located at matching ends of the first and second connectors, e.g., as shown. Any other suitable location is contemplated herein. The specific one of the pairs (e.g., 109 and 113) can be a spare pair or not needed for the function of a circuit. The system can include a module (e.g., 111) configured to monitor the one of the specific pair (e.g., 109 and 113) for engagement to determine if the first and second connector are improperly or properly mated.

In accordance with at least one aspect of this disclosure, a line replaceable unit (LRU), e.g., 102, 202, 302 can include an electrical mating surface 101, 301 as disclosed herein, e.g., as described above. The LRU 102, 202, 302 can include any other suitable components, for example. The opposing mating surface 107, 307 can be part of a motherboard 104, 204, 304 that the LRU 102, 202, 302 can mate with. The LRU 102, 202, 302 can be configured to perform any suitable function or for any suitable use (e.g., aircraft use).

A method can include inserting a plurality of pins of an LRU into a plurality of sockets of a receiving board and detecting if a seating pin of an LRU is fully seated in a seating socket of the receiving board. In certain embodiments, the seating pin can be shorter than the plurality of pins. In certain embodiments, the seating socket can be shorter than the plurality of sockets.

Certain embodiments can include at least one extra shorter pin connection and a logic circuit for detecting when the shorter pin is seated. The shorter extra pin may only connect electrically to the socket on other side if all pins are fully seated, for example. Embodiments can have an LED light indicating the pin is touching other side, or any other suitable logic circuit (e.g., to send a warning to a user for example that the mating surfaces are not properly seated). In certain embodiments, an LED and/or logic circuit can be on circuit boards being inserted, or can be on motherboard receiving the circuit boards.

Embodiments can be used for any mating type surface where there is a pressure connection between electrical interfaces (e.g., USB), for example, or any other suitable mating surface. Embodiments include a method to confirm proper board or LRU seating.

Embodiments can utilize one or more spare connector pins to create a feedback loop to identify when boards that are not seated. Using a shorter than normal pin for this function can allow determining if the board is only partially seated, and an LED or other suitable indicator can be used to annunciate the status. Embodiments can be used with LRUs. Embodiments can provide improved field reliability, fewer zero hour returns, and data can also be used for health management to predict a future issues.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A method, comprising:
   inserting a plurality of pins of an LRU mating surface into a plurality of sockets of a receiving board;
   inserting a plurality of pins of one or more additional LRU mating surfaces
   detecting if a seating pin of an LRU is fully seated in a seating socket of the receiving board; and
   wherein detecting includes, creating a daisy chain circuit between the plurality of pins of the one or more additional LRU mating surfaces and the plurality of sockets such that a contact module is configured to determine if all LRU mating surfaces are properly seated.

2. The method of claim 1, wherein the seating pin is shorter than the plurality of pins.

3. The method of claim 1, wherein the seating socket is shorter than the plurality of sockets.

* * * * *